(12) United States Patent
Sun et al.

(10) Patent No.: US 11,245,101 B2
(45) Date of Patent: Feb. 8, 2022

(54) OLED DISPLAY PANEL, MANUFACTURING METHOD THEREOF, ELECTRONIC DEVICE

(71) Applicants: Hefei Xinsheng Optoelectronics Technology Co., Ltd., Anhui (CN); BOE Technology Group Co., Ltd., Beijing (CN)

(72) Inventors: Shi Sun, Beijing (CN); Xuewu Xie, Beijing (CN); Hao Liu, Beijing (CN); Bowen Liu, Beijing (CN); Yu Ai, Beijing (CN); Yubao Kong, Beijing (CN); Ameng Zhang, Beijing (CN); Yang Xu, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 189 days.

(21) Appl. No.: 16/450,656

(22) Filed: Jun. 24, 2019

(65) Prior Publication Data

US 2020/0020891 A1 Jan. 16, 2020

(30) Foreign Application Priority Data

Jul. 13, 2018 (CN) .......................... 201810770851.2

(51) Int. Cl.
*H01L 51/56* (2006.01)
*H01L 27/32* (2006.01)
(Continued)

(52) U.S. Cl.
CPC .......... *H01L 51/56* (2013.01); *H01L 27/3246* (2013.01); *H01L 51/5012* (2013.01); *H01L 51/5228* (2013.01); *H01L 2251/558* (2013.01)

(58) Field of Classification Search
CPC ................................................ H01L 2251/558
See application file for complete search history.

(56) References Cited

U.S. PATENT DOCUMENTS

2017/0141346 A1* 5/2017 Yao ...................... H01L 27/3279
2018/0254430 A1* 9/2018 Zhao ................... H01L 51/5221

FOREIGN PATENT DOCUMENTS

| CN | 104485350 A | 4/2015 |
| CN | 106148893 A | 11/2016 |
| CN | 107978691 A | 5/2018 |

OTHER PUBLICATIONS

First Office Action and English language translation, CN Application No. 201810770851.2, dated Sep. 27, 2019, 10 pp.

* cited by examiner

*Primary Examiner* — Walter H Swanson
(74) *Attorney, Agent, or Firm* — Myers Bigel, P.A.

(57) ABSTRACT

A manufacturing method of an OLED display panel is provided. At least one of a electroluminescent material layer and a second electrode layer is formed such that a thickness of the second electrode layer in a light emitting region of the OLED display panel is less than that of the second electrode layer in a non-light emitting region of the OLED display panel. The method includes applying charges of a first conductivity type to a layer structure located below a to-be-formed layer and in the light emitting region, applying charges of the first conductivity type to a material of the to-be-formed layer, and applying the material of the to-be-formed layer having the charges of the first conductivity type to the layer structure to form the to-be-formed layer. An OLED display panel manufactured by the above method and an electronic device are further provided.

10 Claims, 3 Drawing Sheets

(51) Int. Cl.
*H01L 51/50* (2006.01)
*H01L 51/52* (2006.01)

OLED DISPLAY PANEL, MANUFACTURING METHOD THEREOF, ELECTRONIC DEVICE

CROSS REFERENCE TO RELATED APPLICATION

The present application claims the benefit of Chinese Patent Application No. 201810770851.2, filed on Jul. 13, 2018, the entire disclosures of which are incorporated herein by reference.

FIELD

The present disclosure relates to the field of display technologies, and particularly to an OLED display panel, a manufacturing method thereof, and an electronic device.

BACKGROUND

Organic light emitting diode (OLED) display devices have advantages such as being self-luminous, having a low driving voltage, a high luminous efficiency, short response time, high definition and contrast, an approximate 180° viewing angle, and a wide operating temperature range, being capable of achieving flexible display and large-area full-color display, and the like, and are hence acknowledged as a most promising display device type in the industry.

A typical OLED device is a top emission type OLED device, which generally comprises a substrate, an anode on the substrate, an organic electroluminescent material layer (EL layer) on the anode, and a cathode on the EL layer. Light of the top emission type OLED is emitted from the side of a cathode electrode layer, and therefore the cathode electrode layer is required to have not only a good electron injecting ability and a small sheet resistance, but also a good light transmittance.

An existing cathode electrode layer is a co-evaporated film layer obtained by co-evaporation of a low work function metal and a high work function metal, for example, a co-evaporated film layer obtained by co-evaporation of magnesium (Mg) and silver (Ag). In the co-evaporated film layer, the ratio of Mg to Ag is increased in order to obtain a satisfactory electron injecting ability, but the light transmittance is decreased. In order to ensure a preferable light transmittance, it is necessary to make the cathode thin, but this will result in an increase in the sheet resistance, an increase in the driving voltage, and a decrease in the voltage stability, eventually resulting in non-uniform display of an OLED display.

SUMMARY

An aspect of the present disclosure provides a manufacturing method of an OLED display panel, comprising: forming, on a substrate, a functional layer including a first electrode layer; forming an electroluminescent material layer on the functional layer; and forming a second electrode layer on the electroluminescent material layer. At least one of the electroluminescent material layer and the second electrode layer is formed by the following steps such that a thickness of the second electrode layer in a light emitting region of the OLED display panel is less than a thickness of the second electrode layer in a non-light emitting region of the OLED display panel: applying charges of a first conductivity type to a layer structure located below a to-be-formed layer and in the light emitting region; applying charges of the first conductivity type to a material of the to-be-formed layer; and applying the material of the to-be-formed layer having the charges of the first conductivity type to the layer structure to form the to-be-formed layer.

In some exemplary embodiments, the to-be-formed layer is the electroluminescent material layer, and the functional layer and the electroluminescent material layer are located in the light emitting region. The manufacturing method further comprises forming an auxiliary electrode on the substrate and in the non-light emitting region, the auxiliary electrode being in direct electrical contact with the second electrode layer. Said forming the electroluminescent material layer on the functional layer comprises: applying charges of the first conductivity type to the auxiliary electrode; applying charges of the first conductivity type to a material of the electroluminescent material layer; and applying the material of the electroluminescent material layer having the charges of the first conductivity type to the functional layer to form the electroluminescent material layer.

In some exemplary embodiments, the auxiliary electrode and the functional layer are simultaneously formed in a same process.

In some exemplary embodiments, the charges of the first conductivity type are applied to the auxiliary electrode by a voltage greater than 15 volts.

In some exemplary embodiments, the second electrode layer is a co-evaporated film layer obtained by co-evaporation of magnesium and silver.

In some exemplary embodiments, the charges of the first conductivity type are applied to the auxiliary electrode via an electrical connection terminal.

In some exemplary embodiments, the electroluminescent material layer is formed by evaporation perfomed by an evaporation apparatus, and the charges of the first conductivity type are applied to the material of the electroluminescent material layer by adding a charged module to the evaporation apparatus.

In some exemplary embodiments, the functional layer further comprises a gate layer and a source-drain electrode layer, and the auxiliary electrode is formed simultaneously with one or more of the gate layer and the source-drain electrode layer.

In some exemplary embodiments, the to-be-formed layer is the second electrode layer, and the layer structure is a portion of the functional layer located in the light emitting region. Said forming the second electrode layer on the electroluminescent material layer comprises: applying charges of the first conductivity type to the portion of the functional layer located in the light emitting region; forming the electroluminescent material layer on the functional layer; applying charges of the first conductivity type to a material of the second electrode layer; and applying the material of the second electrode layer having the charges of the first conductivity type to the electroluminescent material layer to form the second electrode layer.

In some exemplary embodiments, the charges of the first conductivity type are applied to the portion of the functional layer located in the light emitting region by a voltage less than 15 volts.

Another aspect of the present disclosure provides an OLED display panel manufactured by any manufacturing method of an OLED display panel described above. The OLED display panel comprises a functional layer including a first electrode layer, an electroluminescent material layer, and a second electrode layer which are disposed on a substrate successively along a light exit direction, wherein a thickness of the second electrode layer in a light emitting region of the OLED display panel is less than a thickness of the second electrode layer in a non-light emitting region of the OLED display panel.

In some exemplary embodiments, the functional layer and the electroluminescent material layer are located in the light emitting region, and the OLED display panel further comprises an auxiliary electrode located on the substrate and in the non-light emitting region, the auxiliary electrode being in direct electrical contact with the second electrode layer.

In some exemplary embodiments, the functional layer further comprises one or more of a semiconductor layer, one or more insulating layers, a gate metal layer, a source-drain metal layer, a planarization layer, and a pixel defining layer.

In some exemplary embodiments, the functional layer, the electroluminescent material layer, and the second electrode layer are located in the light emitting region and the non-light emitting region.

In some exemplary embodiments, the auxiliary electrode comprises a stack of electrically conductive material layers.

A further aspect of the present disclosure provides an electronic device comprising any OLED display panel described above.

The above description is only an overview of the technical solutions of the present disclosure. In order that the technical measures of the present disclosure can be understood more clearly and implemented in accordance with the contents of the specification, exemplary embodiments of the present disclosure will be described in detail below with reference to the accompanying drawings.

DETAILED DESCRIPTION

Figure 1:
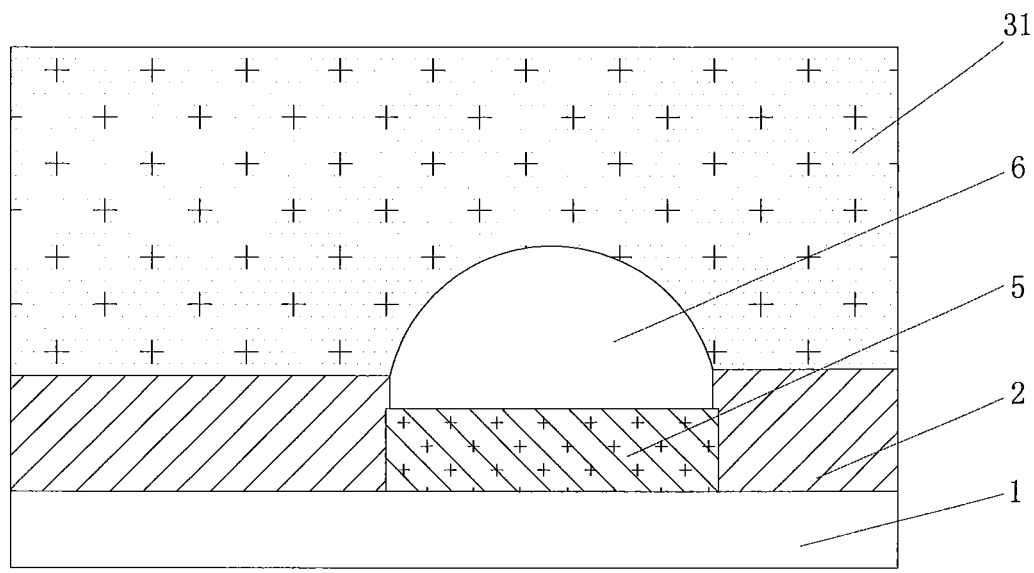
FIGS. 1-2 schematically illustrate steps of a manufacturing method of an OLED display panel provided by an embodiment of the present disclosure, respectively.

To further illustrate the technical measures adopted by the present disclosure for achieving the intended inventive purpose and the effect thereof, implementations, structures, features and effects of the OLED panel, the manufacturing method thereof, and the electronic device proposed by the present disclosure are described in detail below with reference to the accompanying drawings and exemplary embodiments. In the description below, different expressions "an embodiment" or "embodiment" do not necessarily refer to the same embodiment. Furthermore, specific features, structures or characteristics in one or more embodiments may be combined in any suitable form.

An embodiment of the present disclosure provides a manufacturing method of an OLED display panel, comprising: forming, on a substrate, a functional layer including a first electrode layer; forming an electroluminescent material layer on the functional layer; and forming a second electrode layer on the electroluminescent material layer. In particular, at least one of the electroluminescent material layer and the second electrode layer is formed by the following steps such that a thickness of the second electrode layer in a light emitting region of the OLED display panel is less than that of the second electrode layer in a non-light emitting region of the OLED display panel: applying charges of a first conductivity type to a layer structure below a to-be-formed layer and in the light emitting region; applying charges of the first conductivity type to a material of the to-be-formed layer; and applying the material of the to-be-formed layer having the charges of the first conductivity type to the layer structure to form the to-be-formed layer.

As used herein, the "light emitting region" refers to a pixel region of the OLED display panel in which light generated by an organic electroluminescent material exits the panel to realize display. Correspondingly, the "non-light emitting region" refers to a region of the OLED display panel that is located between pixel regions and does not emit light. The non-light emitting region and the light emitting region together constitute a display region of the OLED display panel.

In the above-described method provided by an embodiment of the present disclosure, a layer structure on the substrate corresponding to the light emitting region of the OLED display panel has charges of the same conductivity type as the material of a to-be-formed layer, such that the charges in the layer structure and the charges of the material of the to-be-formed layer are mutually repulsive when the to-be-formed layer is being formed, which makes it difficult and even impossible for the to-be-formed layer to be formed in the light emitting region. As a result, in the resulting OLED display panel, the second electrode layer is thinner in the light emitting region to ensure a good light transmittance, and thicker in the non-light emitting region to ensure a good electron injecting ability and a small sheet resistance of the second electrode layer.

In the above-described method, the second electrode layer located in the light emitting region can be fabricated to be thinner than the second electrode layer located in the non-light emitting region without changing the existing manufacturing order and process for manufacturing respective layers of the OLED display panel. In this way, it is possible to avoid the problem of a large resistance resulting from the entire second electrode layer being thin and the problem of light blocking resulting from the entire electrode layer being thick, without increasing the manufacturing cost and complexity, so that display image of the resulting OLED display is uniform.

Figure 2:
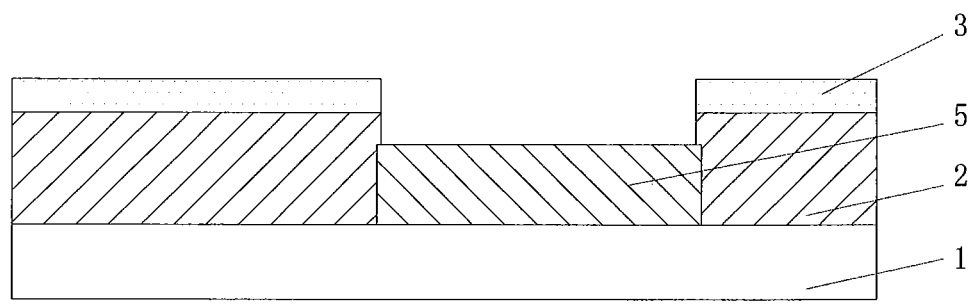
Figure 3:
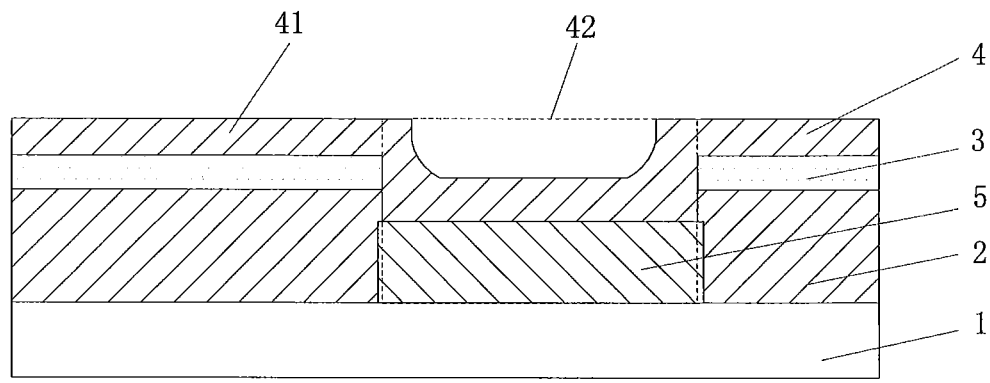
FIG. 3 is a schematic structural view of an OLED display panel manufactured by the manufacturing method of an OLED display panel as shown in FIGS. 1-2.

Upon implementation, when the to-be-formed layer is the electroluminescent material layer, the layer structure may be an auxiliary electrode that is in electrical contact with the second electrode layer to increase the thickness of the second electrode layer in the non-light emitting region, thereby ensuring that the second electrode layer has a good electron injecting ability and a small sheet resistance. Specifically, as shown in FIGS. 1-3, the above manufacturing method comprises forming a functional layer 2 including a first electrode layer on a substrate 1 and in a light emitting region 41 of the OLED display panel, and forming an auxiliary electrode 5 on the substrate 1 and in a non-light emitting region 42 of the OLED display panel. Charges of a first conductivity type (e.g., positive charges) are applied to the auxiliary electrode 5, and charges of the first conductivity type (e.g., positive charges) are also applied to a material 31 that is to form an electroluminescent material layer. Due to the mutual repulsion between the charges of the same conductivity type, the material 31 that is to form an electroluminescent material layer only forms an electroluminescent material layer 3 on a functional layer 2 located in the light emitting region 41, while forming no electroluminescent material layer on the auxiliary electrode 5 located in the non-light emitting region 42. Subsequently, a second electrode layer 4 is formed such that the thickness of the second electrode layer 4 in the light emitting region 41 is less than that of the second electrode layer 4 in the non-light emitting region 42.

As used herein, the term "functional layer" is a generic term for all the different layers between the electroluminescent material layer and the substrate. Therefore, the functional layer may further comprise, in addition to the first electrode layer, one or more of a semiconductor layer, one or more insulating layers, a gate metal layer, a source-drain metal layer, a planarization layer, a pixel defining layer, and the like according to actual conditions. Each of the above film layers can be produced by evaporation, physical vapor deposition, chemical vapor deposition, coating or the like. Further, the manufacturing order of the layers may be set according to needs of implementing functions, and the above layers may be patterned according to needs of implementing functions to obtain a desired pattern arrangement, thereby providing electrical components such as driving transistors, capacitors, resistors, and the like.

Upon implementation, the electroluminescent material layer may be formed on the surface of the functional layer by evaporation, and the second electrode layer may be a co-evaporated film layer obtained by co-evaporation of a low work function metal (the work function thereof is lower than 4.0 eV) and a high work function metal (the work function thereof is higher than 4.0 eV), for example, a co-evaporated film layer obtained by co-evaporation of magnesium (Mg) and silver (Ag), which has a light transmitting property. The thickness of the second electrode layer in the light emitting region and the non-light emitting region may be specifically adjusted by adjusting the amount of charges applied, the process parameters of the co-evaporation process, etc. according to the specific display effect, the requirement on performance, and the like of the OLED display panel. It is to be noted that although the second electrode layer 4 and the auxiliary electrode 5 are shown in FIG. 3 as being in direct contact with the functional layer 2, this does not mean that the second electrode layer 4 or the auxiliary electrode 5 is in electrical contact with the first electrode layer included in the functional layer 2. In fact, the second electrode layer 4 and the auxiliary electrode 5 are electrically insulated from the first electrode layer by means of an insulating layer included in the functional layer 2.

In the above embodiment, the purpose of providing the auxiliary electrode is to avoid the problem of a large resistance due to the second electrode layer being thin. Upon implementation, the auxiliary electrode may be formed together with some of the film layers made of a conductive material in the functional layer, and then the electroluminescent material layer and the second electrode layer are formed on the auxiliary electrode. In order to bring the auxiliary electrode into conduction with the second electrode layer, portions of the second electrode layer and the electroluminescent material layer may be laser-fused to bring the second electrode layer into conduction with the auxiliary electrode. However, this method needs to perform laser processing for each pixel on the OLED display panel, which results in a low production efficiency. Moreover, since the second electrode layer is very thin, regions of the second electrode layer and the auxiliary electrode which are connected by laser processing have a small gap or cavity, resulting in a large on-resistance.

In contrast, by using the above-described method provided by an embodiment of the present disclosure, when the electroluminescent material layer 3 is being formed, positive or negative charges are applied to the auxiliary electrode 5, and charges of the same type are applied to the material 31 that is to form the electroluminescent material layer 3. Therefore, when the electroluminescent material 31 is being applied, a sufficiently large repulsive force is generated between the auxiliary electrode 5 and the electroluminescent material 31 to thereby form a vacant region 6 between them, such that the electroluminescent material 31 cannot be applied to the surface of the auxiliary electrode 5. Moreover, since no charge is applied to the functional layer 2, the electroluminescent material 31 is normally applied to the surface of the functional layer 2, as shown in FIG. 2. Subsequently, as shown in FIG. 3, the second electrode layer 4 is formed on the electroluminescent material layer 3 and the auxiliary electrode 5. At that time, the connection between the formed second electrode layer 4 and the auxiliary electrode 5 has a large area, so that no large on-resistance will be generated. Furthermore, after the second electrode layer 4 is connected to the auxiliary electrode 5, the overall thickness of the electrode layer in the non-light emitting region 42 is large, which effectively solves the problem regarding a large resistance of the thin second electrode layer 4, so that the image displayed by the OLED display has a uniform effect.

In an exemplary embodiment, the charges of the first conductivity type are applied to the auxiliary electrode 5 by a voltage greater than 15 volts.

When the voltage applied to the auxiliary electrode is greater than 15 volts, it is ensured that the repulsive force generated between the auxiliary electrode and the electroluminescent material is sufficiently large, so that the electroluminescent material is not applied to the surface of the auxiliary electrode. Of course, those skilled in the art can specifically set the magnitude of the applied voltage according to the use of the materials during the process of fabricating the plated layer and the area of plating.

In an exemplary embodiment, the charges of the first conductivity type are applied to the auxiliary electrode through an electrical connection terminal.

Upon implementation, since the OLED display panel comprises a plurality of pixels, and each of the pixels is provided with an auxiliary electrode, it is necessary to apply the charges of the first conductivity type to the auxiliary electrodes in all the pixels. To this end, a connection line may be disposed, or a lead-out terminal of the auxiliary electrode may be reserved when the auxiliary electrode being etched, and then the auxiliary electrodes are electrically connected together via short bars to facilitate probe power supply. Accordingly, the electroluminescent material evaporation apparatus may be improved to have a probe power supply unit to ensure that charges can be applied to the auxiliary electrode.

In an exemplary embodiment, charges may be applied to the electroluminescent material by adding a charged module above each evaporation source of the electroluminescent material evaporation apparatus, wherein the charged module of the evaporation source may be an ion source such that the evaporated non-molecular electroluminescent material particles are charged.

In an exemplary embodiment, the functional layer 2 described above further comprises a gate layer and a source-drain electrode layer. In this case, the auxiliary electrode may be formed simultaneously with one or more of the first electrode layer, the gate layer, and the source-drain electrode layer. That is, the formed auxiliary electrode may comprise a plurality of conductive layers.

Figure 4:
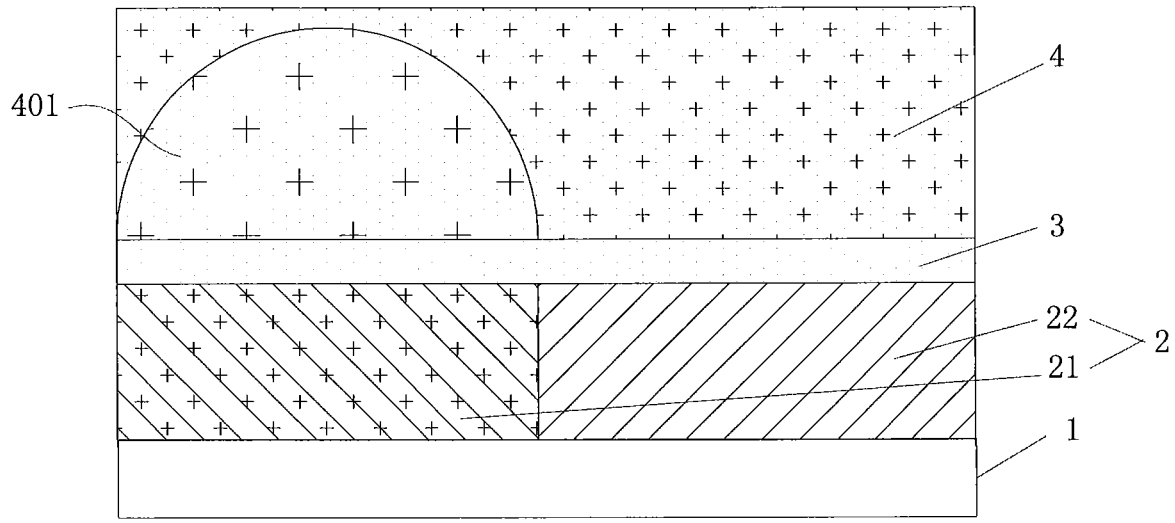
FIG. 4 schematically illustrates steps of another manufacturing method of an OLED display panel provided by an embodiment of the present disclosure.
Figure 5:
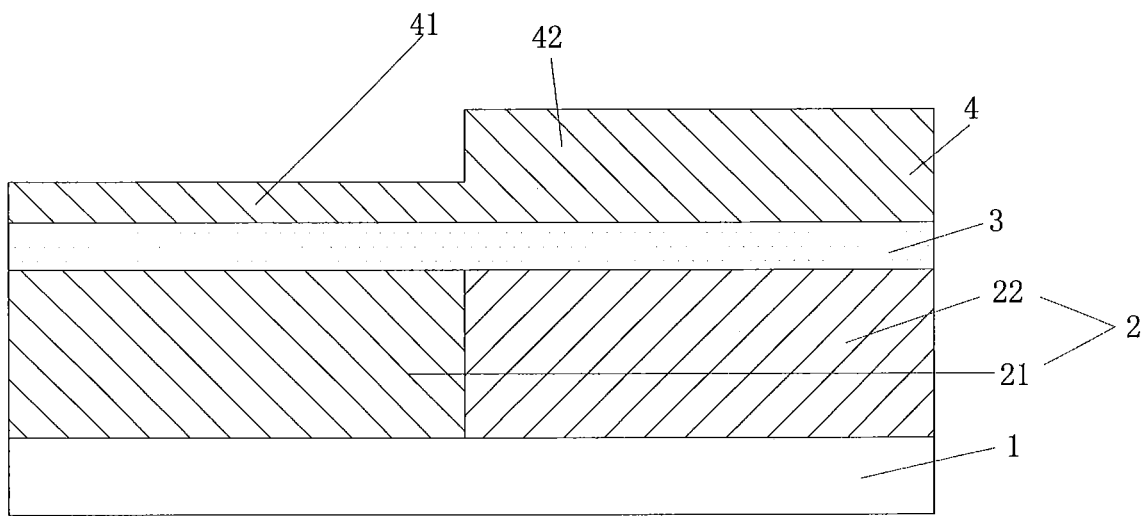
FIG. 5 is a schematic structural view of an OLED display panel manufactured by the manufacturing method of an OLED display panel as shown in FIG. 4.

Alternatively, upon implementation, when the to-be-formed layer is the second electrode layer, the above layer structure may be a portion of the functional layer located in the light emitting region. Specifically, as shown in FIGS. 4-5, the above-described manufacturing method comprises forming a functional layer 2 including a first electrode layer on a substrate 1. Charges of a first conductivity type (e.g., positive charges) are applied to a portion 21 of the functional layer 2 located in a light emitting region 41 of the OLED display panel, and a portion 22 of the functional layer 2 located in a non-light emitting region 42 of the OLED display panel is uncharged. Then, an electroluminescent material layer 3 is formed on the functional layer 2. Charges of the first conductivity type (e.g., positive charges) are also applied to the material that is to form a second electrode layer. Due to the mutual repulsion between the charges of the same conductivity type, the material that is to form the second electrode layer is less applied to the portion of the electroluminescent material layer 3 located in the light emitting region 41, and is more applied to the portion of the electroluminescent material layer 3 located in the non-light emitting region 42, such that the thickness of the second electrode layer 4 in the light emitting region 41 is less than that of the second electrode layer 4 in the non-light emitting region 42.

In the above embodiment, the resistance of the second electrode layer 4 is not adjusted using the auxiliary electrode, but is adjusted directly by adjusting the thickness of the second electrode layer 4. Since the second electrode layer 4 located in the light emitting region 41 needs to be thin to ensure the light transmittance, when the second electrode layer 4 is being formed, it is possible to apply charges to the portion 21 of the functional layer 2 located in the light emitting region, and then apply charges of the same conductivity type to the electrode material forming the second electrode layer 4, such that a repulsive force of a certain magnitude is generated between the electrode material and the portion 21 of the functional layer 2 when the electrode material of the second electrode layer 4 is applied, thereby forming a space 401 having a repulsive force. The magnitude of the repulsive force in the space 401 can be controlled by adjusting the amount of charges applied to the portion 21. In this way, the thickness of the second electrode layer 4 formed in the light emitting region 41 can be controlled, such that the portion of the second electrode layer 4 corresponding to the light emitting region 41 is thinner, and the portion of the second electrode layer 4 corresponding to the non-light emitting region 42 is thicker so as to solve the problem regarding a too large resistance of the thin second electrode layer 4 on the one hand, and improve the light transmittance of the second electrode layer 4 in the light emitting region on the other hand.

In an exemplary embodiment, charges are applied to the portion 21 of the functional layer 2 located in the light emitting region 41 by a voltage less than 15 volts in order to avoid the absence of the second electrode layer from the light emitting region 41 due to a too large repulsive force resulting from a too high voltage.

In another aspect of the present disclosure, there is provided an OLED display panel. The OLED display panel comprises a functional layer including a first electrode layer, an electroluminescent material layer, and a second electrode layer which are successively disposed on a substrate along a light exit direction, wherein the thickness of the second electrode layer in the light emitting region of the OLED display panel is less than that of the second electrode layer in the non-light emitting region of the OLED display panel.

In the above OLED display panel provided by an embodiment of the present disclosure, the second electrode layer is made thinner in the light emitting region to ensure a good light transmittance, and made thicker in the non-light emitting region to ensure a good electron injecting ability and a small sheet resistance.

Specifically, in an exemplary embodiment, as shown in FIG. 3, the OLED display panel comprises a functional layer 2 including a first electrode layer, an electroluminescent material layer 3, and a second electrode layer 4 which are successively disposed on a substrate 1 along a light exit direction. The thickness of the second electrode layer 4 in the light emitting region 41 of the OLED display panel is less than that of the second electrode layer 4 in the non-light emitting region 42 of the OLED display panel. Specifically, the functional layer 2 and the electroluminescent material layer 3 are located in the light emitting region 41, and the OLED display panel further comprises an auxiliary electrode 5 located on the substrate 1 and in the non-light emitting region 42. The auxiliary electrode 5 is in direct electrical contact with the second electrode layer 4 to increase the thickness of the second electrode layer 4 in the non-light emitting region 42.

In the above embodiment, the functional layer further comprises, in addition to the first electrode layer, one or more of a semiconductor layer, one or more insulating layers, a gate metal layer, a source-drain metal layer, a planarization layer, a pixel defining layer, and the like according to actual conditions. The above film layers can be produced by evaporation, physical vapor deposition, chemical vapor deposition, coating or the like. Further, the manufacturing order of the layers may be set according to needs of implementing functions, and the above layers may be patterned according to needs of implementing functions to obtain a desired pattern arrangement, thereby providing electrical components such as driving transistors, capacitors, resistors, and the like.

Upon implementation, the electroluminescent material layer may be formed on the surface of the functional layer by evaporation, and the second electrode layer may be a co-evaporated film layer obtained by co-evaporation of a low work function metal (the work function thereof is lower than 4.0 eV) and a high work function metal (the work function thereof is higher than 4.0 eV), for example, a co-evaporated film layer obtained by co-evaporation of magnesium (Mg) and silver (Ag), which has a light transmitting property. The thickness of the second electrode layer in the light emitting region and the non-light emitting region may be specifically adjusted by adjusting the amount of charges applied, the process parameters of the co-evaporation process, etc. according to the specific display effect, the requirement on performance, and the like of the OLED display panel.

In another exemplary embodiment, as shown in FIG. 5, the OLED display panel comprises a functional layer 2 including a first electrode layer, an electroluminescent material layer 3 and a second electrode layer 4 which are successively disposed on a substrate 1 along a light exit direction. The thickness of the second electrode layer 4 in the light emitting region 41 of the OLED display panel is less than that of the second electrode layer 4 in the non-light emitting region 42 of the OLED display panel.

In the above OLED display panel provided by an embodiment of the present disclosure, the second electrode layer corresponding to the light emitting region is set to be thinner than that corresponding to the non-light emitting region, so that the second electrode layer on the one hand has a good light transmittance in the light emitting region, and on the other hand has a reduced resistance, thereby ensuring uniformity of the displayed image.

Figure 6:
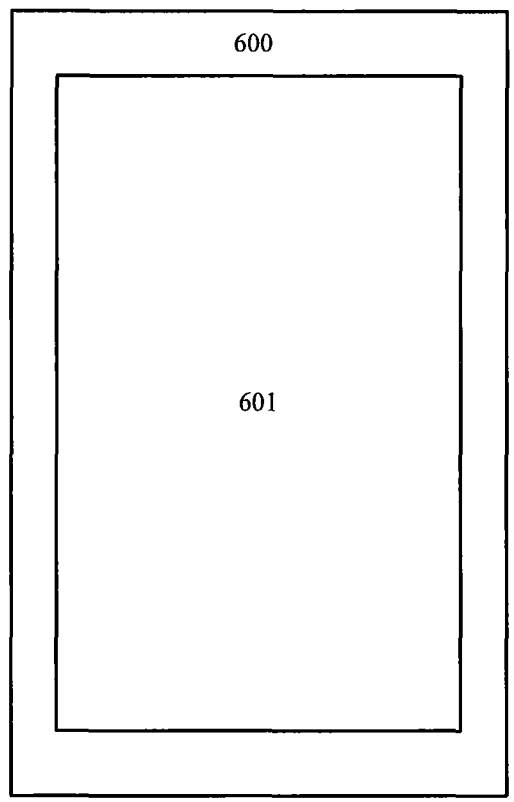
FIG. 6 is a schematic top view of a display device provided by an embodiment of the present disclosure.

An embodiment of the present disclosure further provides an electronic device 600, as shown in FIG. 6, comprising any OLED display panel 601 described above.

In the above OLED display device provided by an embodiment of the present disclosure, the second electrode layer corresponding to the light emitting region is set to be thinner than that corresponding to the non-light emitting region, so that the second electrode layer on the one hand has a good light transmittance in the light emitting region, and on the other hand has a reduced resistance, thereby ensuring uniformity of the displayed image.

What have been stated above are only exemplary embodiments of the present disclosure, and are not intended to limit the present disclosure in any way. Any simple amendments, equivalent variations and modifications made to the above embodiments in accordance with the technical essence of the present disclosure still fall within the scope of the technical solutions of the present disclosure.

The invention claimed is:

1. An OLED display panel comprising:
a functional layer comprising a first electrode layer, an electroluminescent material layer, and a second electrode layer which are on a substrate successively along a light exit direction,
wherein a first thickness of the second electrode layer in a light emitting region of the OLED display panel is less than a second thickness of the second electrode layer in a non-light emitting region of the OLED display panel,
wherein the second electrode layer comprises a first metal and a second metal, and a work function of the first metal is smaller than a work function of the second metal, and
wherein a portion of the second electrode layer in the non-light emitting region of the OLED display panel comprises a groove, and a side surface of the electroluminescent material layer perpendicular to the substrate and close to the groove is in direct contact with the portion of the second electrode layer in the non-light emitting region of the OLED display panel.

2. The OLED display panel according to claim 1, wherein the functional layer and the electroluminescent material layer are in the light emitting region, and wherein the OLED display panel further comprises:
an auxiliary electrode on the substrate and in the non-light emitting region,
wherein the auxiliary electrode is in direct electrical contact with the second electrode layer.

3. The OLED display panel according to claim 1, wherein the functional layer further comprises one or more of a semiconductor layer, one or more insulating layers, a gate metal layer, a source-drain metal layer, a planarization layer, or a pixel defining layer.

4. The OLED display panel according to claim 1, wherein the functional layer, the electroluminescent material layer, and the second electrode layer are in the light emitting region and the non-light emitting region.

5. The OLED display panel according to claim 2, wherein the auxiliary electrode comprises a stack of electrically conductive material layers.

6. An electronic device comprising the OLED display panel according to claim 1.

7. The electronic device according to claim 6,
wherein the functional layer and the electroluminescent material layer are in the light emitting region,
wherein the OLED display panel further comprises an auxiliary electrode on the substrate and in the non-light emitting region, and
wherein the auxiliary electrode is in direct electrical contact with the second electrode layer.

8. The electronic device according to claim 6, wherein the functional layer further comprises one or more of a semiconductor layer, one or more insulating layers, a gate metal layer, a source-drain metal layer, a planarization layer, or a pixel defining layer.

9. The electronic device according to claim 6, wherein the functional layer, the electroluminescent material layer, and the second electrode layer are in the light emitting region and the non-light emitting region.

10. The electronic device according to claim 7, wherein the auxiliary electrode comprises a stack of electrically conductive material layers.

* * * * *